United States Patent [19]

Jo

[11] Patent Number: 6,064,587
[45] Date of Patent: May 16, 2000

[54] SYSTEM AND METHOD FOR WRITING/READING DATA

[75] Inventor: William Jo, Seoul, Rep. of Korea

[73] Assignee: LG Electronics Inc., Seoul, Rep. of Korea

[21] Appl. No.: 09/343,046

[22] Filed: Jun. 29, 1999

[30] Foreign Application Priority Data

Jul. 2, 1998 [KR] Rep. of Korea ............ 98-26664

[51] Int. Cl.$^7$ .................. G11C 11/22; G11C 11/50
[52] U.S. Cl. ................................ 365/145; 365/164
[58] Field of Search .......................... 365/145, 164

[56] References Cited

U.S. PATENT DOCUMENTS

| | | | |
|---|---|---|---|
| 5,886,922 | 3/1999 | Raatikainen et al. | 365/164 |
| 5,953,306 | 9/1999 | Yi | 365/164 |

*Primary Examiner*—Trong Phan
*Attorney, Agent, or Firm*—Fleshner & Kim, LLP

[57] ABSTRACT

System and method for writing/reading data, the method including the steps of causing polarization inversion at domains of the ferroelectric thin film using a conductive nano tip for writing the data, and reading the data using a non-conductive nano tip.

10 Claims, 5 Drawing Sheets

SYSTEM AND METHOD FOR WRITING/READING DATA

BACKGROUND OF THE INVENTION

1. Field of the Invention

The present invention relates to an data storage system, and more particularly, to system and method for writing/reading data.

2. Background of the Related Art

In general, in the ferroelectric thin film memory, there are FRAM {Ferroelectric(non-volatile) Random Access Memory} of one transistor/one capacitor type as shown in FIG. 1 and Fe-FET(Ferroelectric Field-Effect Transistor) having a ferroelectric layer on a gate region as shown in FIG. 2. Recently, as the former has a structure and peripheral circuits similar to a DRAM (Dynamic Random Access Memory), many semiconductor production companies pay attention to the FRAM. It is recent trend that Ramtron of the USA or ROHM of Japan disclose fabrication of 64K FRAM and large sized DRAM companies are absorbed in researches and developments of 1M or 4M FRAM. However, being of a DRO(Destructive readout) type, the FRAM structure shows fatigue of the ferroelectric capacitor (spontaneous polarization is reduced as cycling is repeated) and has difficulty in high density packing of the devices as two transistors/two capacitors are used in a cell for improving a device reliability. Since a current device packing density of the DRAM is around 256 DRAM, it seems difficult that a device packing density of the FRAM is elevated to a high level within a short time. On the other hand, the Fe-FET type has difficulty in putting into practical use due to difficulty in realization, despite of its advantage of being an NDRO(Non-destructive readout) type drive. The difficulty comes from various problems, such as difficulty in injecting charges to an interface of a semiconductor of Si and a ferroelectric substance as the semiconductor and the ferroelectric substance should be bonded, directly. The recent development of scanning probe microscopy leads to a significant development of a technology for observing a structure of a size below 100 Å, to level at which even an atom(of a size below 2 Å) can be detected in a high vacuum. If a ferroelectric domain(a size of domain may be around a few hundred Å even though it is dependent on thermodynamic conditions) can be put under control and up/down of the domain can be detected, it can be expected that a data storage with a high device packing density each with very small scale (approx. over 100 Gbit/in$^2$) can be realized. However, because the related art ferroelectric non-volatile memory has a limitation in high density writing and reading of data in view of its structure, there have been many difficulties in integrating the ferroelectric non-volatile memory.

SUMMARY OF THE INVENTION

Accordingly, the present invention is directed to system and method for writing/reading data that substantially obviates one or more of the problems due to limitations and disadvantages of the related art.

An object of the present invention is to provide system and method for writing/reading data, which allows high density writing and reading of data for improving a memory density, substantially.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the data storage system includes a ferroelectric storage media having an electrode and a ferroelectric thin film formed on the electrode, a conductive, nano tip for writing data to the storage media, and a non-conductive nano tip for reading the data from the storage media.

The non-conductive nano tip is an electro-optic nano tip which reads data by detecting a polarization state of a light caused by a near-field, a piezoelectric tip of which displacement depending on a polarization direction of the ferroelectric domain is detected for reading the data, or a non-linear optical tip which detects a quantity change of an incident light intensity caused by phase matching for reading the data.

In other aspect of the present invention, there is provided a method for writing/reading data using a system having a storage media with an electrode and a ferroelectric thin film, including the steps of causing polarization inversion at domains of the ferroelectric thin film using a conductive nano tip for writing the data, and reading the data using a non-conductive nano tip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
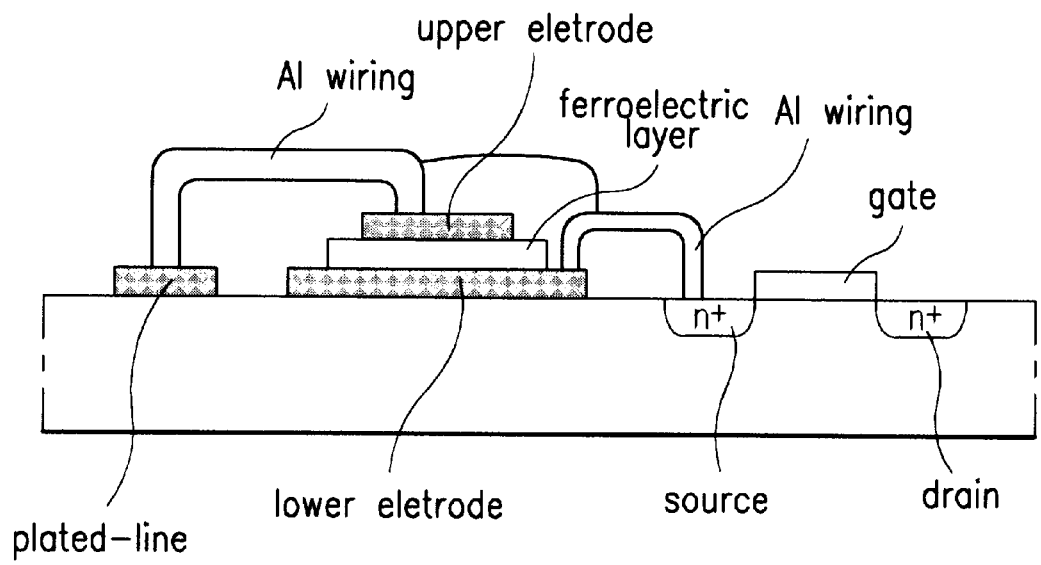
FIGS. 1 and 2 illustrate related art ferroelectric non-volatile memories, respectively.
Figure 2:
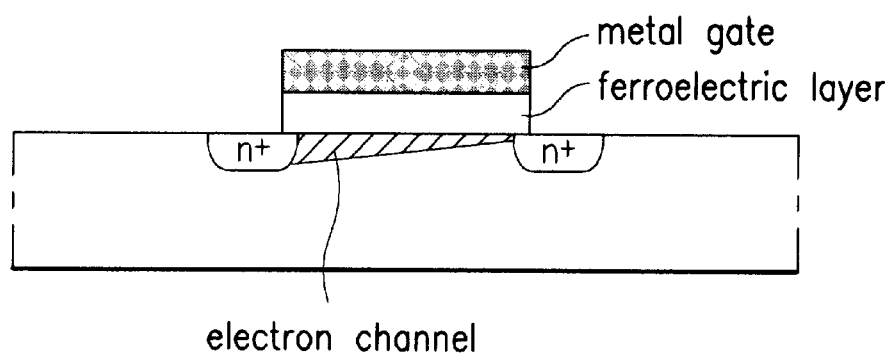
Figure 3:
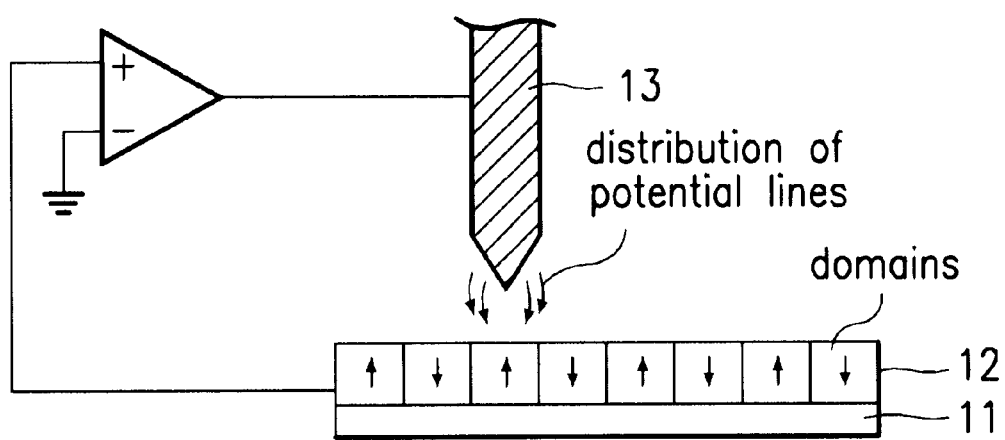
FIGS. 3 and 4 illustrate a method for writing data to a ferroelectric thin film using a system for writing/reading data in accordance with a preferred embodiment of the present invention; and, FIGS. 5A, 5B and 5C illustrate methods for reading data from a ferroelectric thin film using a system for writing/reading data in accordance with a preferred embodiment of the present invention.
Figure 4:
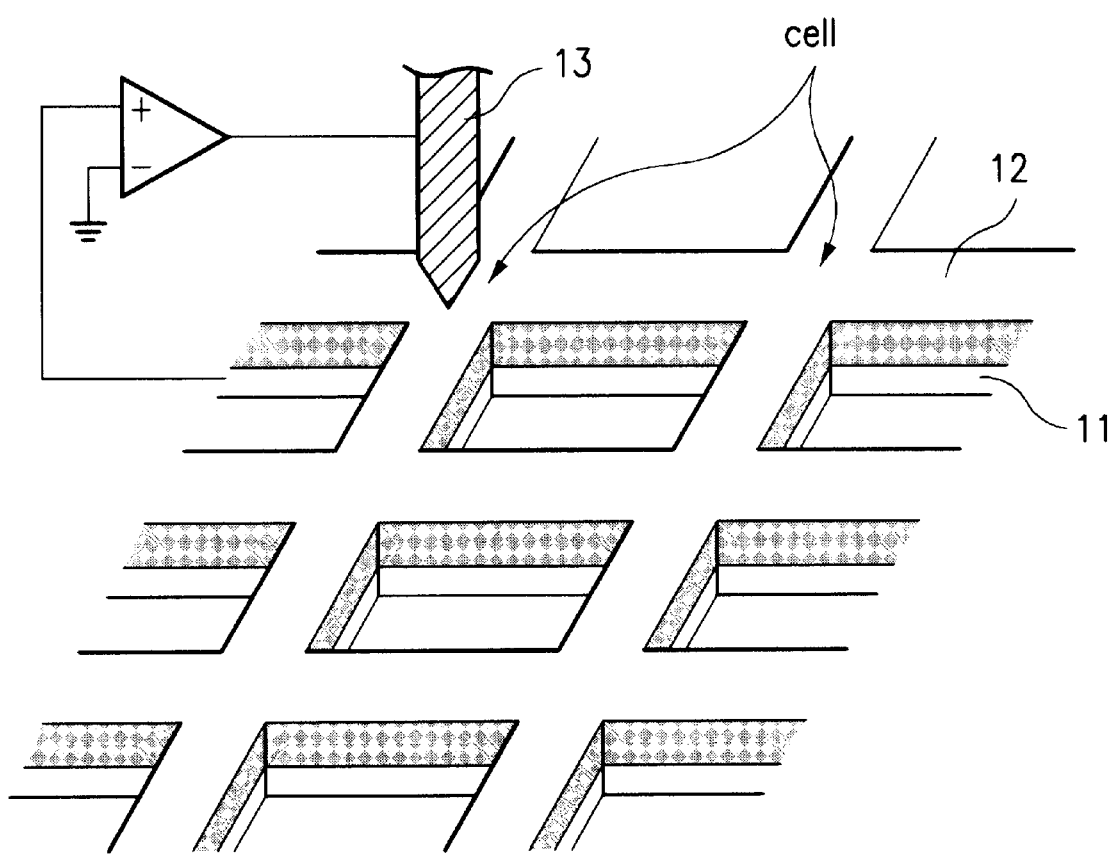

Reference will now be made in detail to the preferred embodiments of the present invention, examples of which are illustrated in the accompanying drawings. As shown in FIG. 3, having an eye to the fact that a ferroelectric polarization can be occurred and inverted merely by means of a metal nano tip, the present invention suggests high density writing and reading of data on a ferroelectric non-volatile memory merely having a lower electrode 11 and a ferroelectric film 12 without an upper electrode using a nano tip 13. As shown in FIG. 4, in the present invention, the lower electrode 11 is not left intact in a simple planar form as it was, but formed to be of a network or matrix pattern by photolithography for providing a bit concept. Then, a ferroelectric film 12 is formed on the lower electrode 1 1, for writing and reading data at each cell position using the nano tip 13.

Methods for writing and reading data using the nano tip will be explained.

Method for Writing Data

As shown in FIG. 3, data is written by forming a ferroelectric film 12 on a lower electrode 11 and inducing a spontaneous polarization at a domain of the ferroelectric film 12 by means of a metal nano tip 13. In order to obtain a bistable characteristic, the spontaneous polarization of the ferroelectric film 12 should be readily inverted even by a low voltage. To do this, a domain of a minimum unit size is required, which can be inverted even by a small tip. That is, since one time inversion of plural domains requires large energy and(requires a high voltage) and causes difficulty in maintenance of data, a ferroelectric thin film technology for putting the domains under control is required, and a ferroelectric material used should also be a material with a small coercive field which permits inversion with a low voltage, for example, a material, such as $Bi_4Ti_3O_{12}$ or appropriately doped PZT. And, the nano tip 13 is a tip coated with a metal, such as silicon, or a tungsten tip used in scanning tunneling microscope.

Method for Reading Data

For reading the written data by using the metal nano tip, a flow of current is required. Therefore, other method for direct reading of the spontaneous polarization of the ferroelectric thin film is required. There are different properties of a ferroelectric material related to the spontaneous polarization; a piezoelectricity effect, an electro-optic effect and a non-linear optical effect, using which the polarization of the ferroelectric material can be read.

Figure 5A:
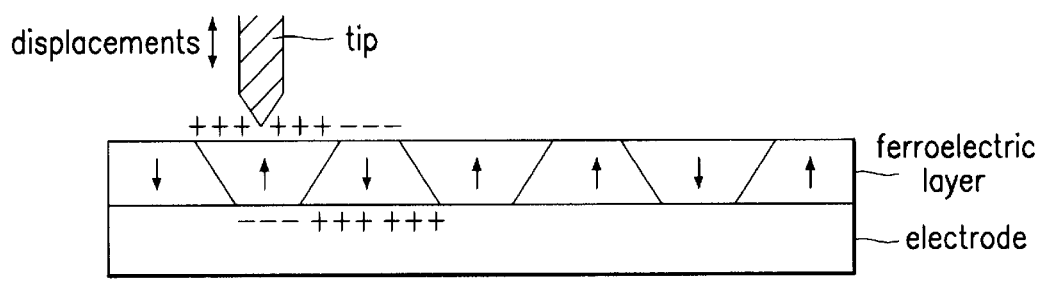

As shown in FIG. 5A, in a method using the piezoelectricity effect, a piezoelectric tip (a tip used in an existing atomic force microscope) of non-metallic, such as Si or Si3N4, is used in making distinction of piezoelectric reactions along the ferroelectric domains for reading the data. That is, since directions of displacements of the tip are opposite between when the polarization of the ferroelectric domain is up (positive charge) and when the polarization of the ferroelectric domain is down (negative charge), the displacements of the piezoelectric tip are measured using a feed back circuit, for identifying the polarization state of the charged domain. This method requires detection by an AC modulator for making distinction from a noise and obtaining a data by a lock-in amplification.

Figure 5B:
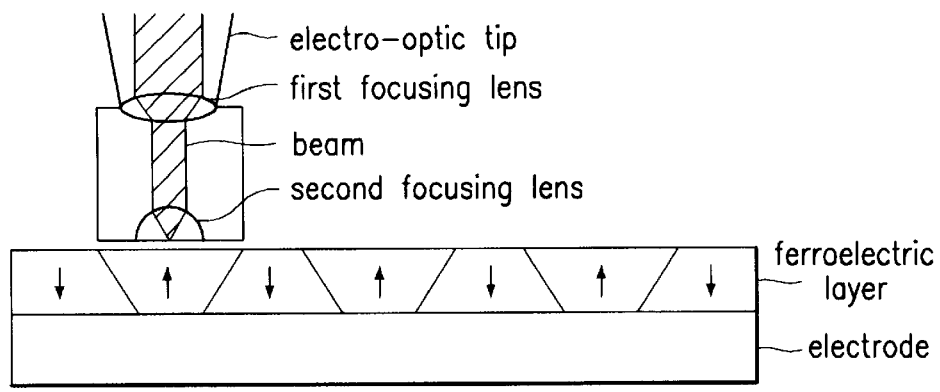

As shown in FIG. 5B, in a method using the electro-optic effect, a polarization state caused by a near-field is detected for reading the data. The electro-optic effect is an effect in which a refractive index of the ferroelectric material and the like becomes anisotropic as a DC field is changed, using which polarization of a light can be put under control. If polarization directions of different ferroelectric domains are fixed, the polarizations of lights passing through the domains differ with the polarization directions. In order to utilize such an electro-optic effect, first of all, an appropriate beam size and an optical system for detecting the beam are required. If a light with a wavelength of approx. 650 nm (6500 Å) used in a current disk is used, a distance shorter than approx. 200 nm can not be resolved no matter how much the light is focused by a lens. Consequently, the present invention introduces a near-field optics. If the nearfield technology, which has made a substantial development, is employed, the polarization state in the near-field can be read. A current near-field technology, which can provide a resolution below approx. 100 Å, has an adequate resolution enough to read a polarization state of a nano grain.

Figure 5C:
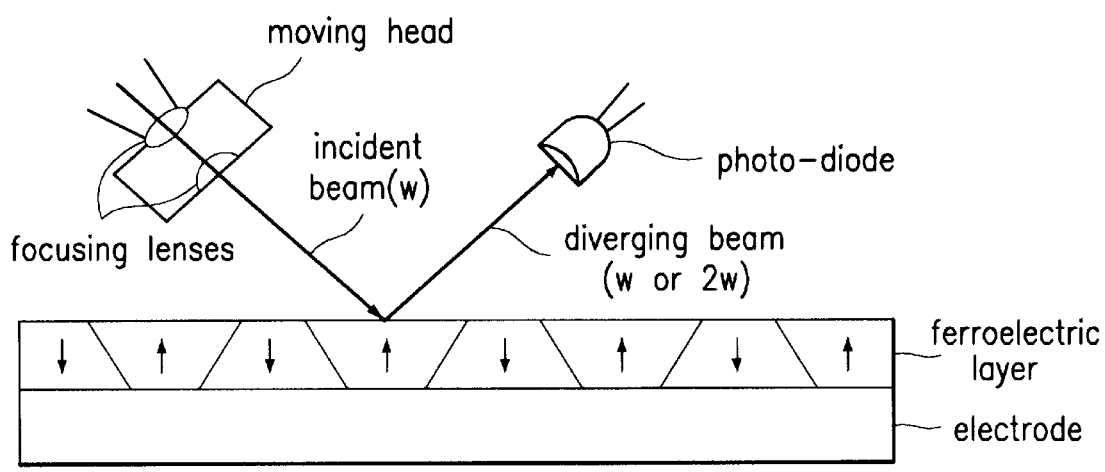

In the meantime, as shown in FIG. 5C, in a method using the non-linear optical effect, a change of light intensity caused by phase matching of an incident light is detected for reading data. The non-linear optical effect, inclusive of the electro-optic effect, is an effect caused by interaction between a strong light and a substance, such as the second harmonic generation, the Kerr effect, the two/four wave mixing, and the like. The field of holography, for which many researches are underway for use as a three dimensional memory, also is closely related to the non-linear optical effect, because most of the photorefractive materials used in the holography are also non-linear optical materials that show the non-linear optical effect. The present invention utilizes the second harmonic generation in which a 2 W light is emitted for a W incident light. The second harmonic generation provides the 2 W light at a maximum efficiency when a direction of the W incident light is matched with an ellipsoid index of the material at a specific angle, which is called as phase matching. If the direction of the incident light is fixed, an angle at which the phase matching is occurred differs with the polarization direction of the ferroelectric domain, resulting to differ the intensities of the 2 W lights from the domains with the polarization direction. Therefore, as shown in FIG. 5C, if an optical system is fixed on one side and a photodiode which is sensitive to the 2 W light is fixed on the other side, a state of the domain can be observed.

The aforementioned methods may be selected as appropriate to a material since the methods have advantages and disadvantages. That is, one of the methods most suitable to a characteristic should be selected by determining whether the inversion of the polarization of the domain is easy or not(whether the inversion of the polarization is occurred even at a low voltage), and whether the polarization which determines a domain is changed in two directions or not, or in three directions.

As has been explained, the device and method for writing/reading data facilitates fabrication of a high density data storage because a high density writing and reading of data is made possible by inducing a spontaneous polarization and causing a polarization inversion using a nano tip instead of an upper electrode.

It will be apparent to those skilled in the art that various modifications and variations can be made in the device and method for writing/reading data of the present invention without departing from the spirit or scope of the invention. Thus, it is intended that the present invention cover the modifications and variations of this invention provided they come within the scope of the appended claims and their equivalents.

What is claimed is:

1. An data storage system comprising:
   a ferroelectric storage media having an electrode and a ferroelectric thin film formed on the electrode;
   a conductive nano tip for writing data to the storage media; and,
   a non-conductive nano tip for reading the data from the storage media.

2. A system as claimed in claim 1, wherein the electrodes in the storage media form a matrix.

3. A system as claimed in claim 1, wherein the ferroelectric thin film is formed of a material having a small coercive field.

4. A system as claimed in claim 3, wherein the material is $Bi_4Ti_3O_{12}$ or appropriately doped PZT.

5. A system as claimed in claim 1, wherein the nano tip is either a tungsten tip or a silicon coated tip.

6. A method for writing/reading data using a system having a storage media with an electrode and a ferroelectric thin film, the method comprising the steps of:

causing polarization inversion at domains of the ferroelectric thin film using a conductive nano tip for writing the data; and, reading the data using a non-conductive nano tip.

7. A method as claimed in claim 6, wherein the non-conductive nano tip is an electro-optic nano tip which reads data by detecting a polarization state of a light caused by a near-field.

8. A method as claimed in claim 6, wherein the non-conductive nano tip is a piezoelectric tip of which displacement depending on a polarization direction of the ferroelectric domain is detected for reading the data.

9. A method as claimed in claim 6, wherein the non-conductive nano tip is a non-linear optical tip which detects a change of an incident light intensity caused by phase matching for reading the data.

10. A method as claimed in claim 6, wherein the change of the incident light intensity is detected by a photodiode.

* * * * *